Oct. 11, 1966 P. M. DANZER 3,278,862
CRYSTAL CONTROLLED SYNCHRONIZED OSCILLATOR
Filed June 19, 1964
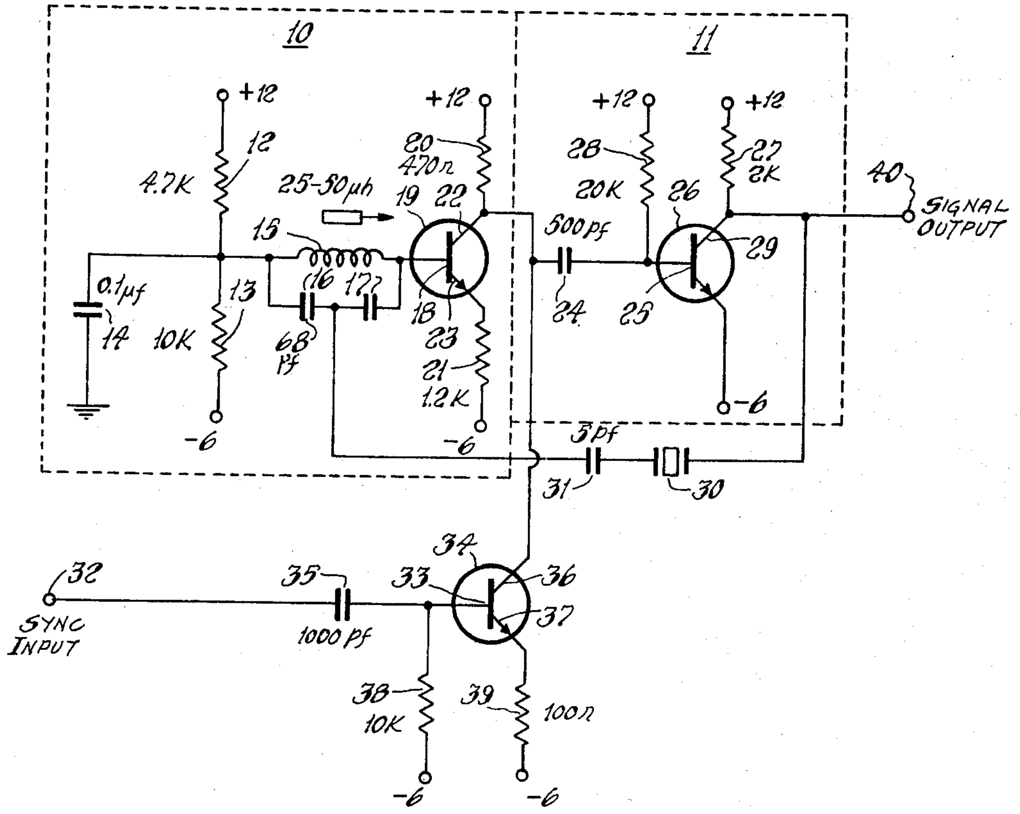
INVENTOR.
PAUL M. DANZER
BY Ernest F. Weinberger
Max L. Harmer
ATTORNEYS United States Patent Office 3,278,862

Patented Oct. 11, 1966

3,278,862

CRYSTAL CONTROLLED SYNCHRONIZED OSCILLATOR

Paul M. Danzer, South Plainfield, N.J., assignor, by mesne assignments, to the United States of America as represented by the Secretary of the Navy Filed June 19, 1964, Ser. No. 376,603
6 Claims. (Cl. 331—116)

This invention relates in general to a crystal oscillator and more particularly to a crystal controlled synchronized oscillator employing transistor circuitry.

As a general rule pulse controlled oscillators of the variety that fall within the functions performed by the subject of this invention necessitate the use of a precision bridge network. Further under these conditions the crystal employed to obtain the necessary stability must be active, namely act as an A.C. generator.

In view of the foregoing it is an object of this invention to provide a simple, inexpensive, stable, phased transistorized, pulsed oscillator employing crystal frequency control.

It is a further object to provide a crystal controlled synchronized oscillator wherein the crystal is employed as a passive element.

It will be understood that various changes in the details, materials and arrangements of parts, which have been herein described and illustrated in order to explain the nature of the invention, may be made by those skilled in the art within the principle and scope of the invention as expressed in the appended claims.

The single figure of this application is a schematic diagram of an embodiment made in accordance with the principle of this invention.

In the illustrated embodiment of the invention stage 10 feeds an inverter-amplifier section 11 which in turn is regeneratively coupled back to the stage 10 to form the oscillator. Resistors 12 and 13 provide the proper base bias when they are connected to sources of opposite polarity while capacitor 14 by-passes the A.C. and blocks the D.C. This capacitor is connected to the junction between the base bias resistors. Similarly connected thereto is a tank circuit including tunable inductor 15 and divider capacitors 16 and 17. The other end of the tank circuit is connected to the base element 18 of transistor 19. Resistor 20 provides the proper bias for collector 22 while bias resistor 21 is joined to the emitter 23. The output of collector 22 is coupled by way of coupling capacitor 24 to the base 25 of transistor 26. Resistors 27 and 28 provide the proper collector and base biases for transistor 26. The oscillator output is derived at collector 29 which at the same time is fed back to the capacitor divider (16, 17) through crystal 30 and capacitor 31.

A sync input terminal 32 is joined to the base element 33 of sync transistor 34 through input capacitor 35. The collector 36 is tied to the collector 20 of oscillator transistor 19 while the proper bias for the base 33 and emitter 37 is provided through resistors 38 and 39. Having described the circuit components and their interrelationship it remains to describe the circuitry operation and function.

A high frequency or R.F. signal is generated in the oscillator stage and the oscillatory loop having therein the crystal 30 which under the network shown acts as a narrow band filter joins the stage 11 output to the capacitive divider input. Under these conditions a C.W. signal would always be present at the signal output terminal 40 and has its frequency determined by the tank circuit and the narrow band filter crystal 30. For the component values illustrated the oscillatory frequency is approximately 3.3 mc. although other frequencies are readily attainable. A synchronizing trigger pulse is applied at input terminal 32 and through capacitor 35 to base 33. When this trigger pulse is positive it allows transistor 34 to conduct from collector to emitter, or in effect through collector resistor 20 of oscillator transistor 19 thus drawing current through this resistor. If this trigger pulse, however, is negative the transistor 34 circuit can be modified, as is well known, so as to accept a negative trigger pulse to cause the transistor to conduct. This current drops the potential at the collector 22 and holds the oscillator off for the entire duration of the trigger. The transistor 34 is operated as a transistor switch and the base 33 constitutes the control element in much the same manner as a vacuum triode or a thyratron. With a certain current (trigger pulse) applied to the base 34, or positive voltage to the grid of a tube, the device is made to conduct and act as an extremely low impedance device. This action is maintained even though the plate or collector voltage is substantially lowered. This is especially true in the case of a transistor where the base current which is small controls an extremely large collector-emitter current. It should be noted that the "bias" applied to the base of the switching transistor 34 is different from that of transistor 19 so that where one transistor (34) is effectively a short circuit (collector-emitter) the other with the same collector voltage can be cut-off. When the trigger pulse terminates, collector 22 again rises in potential and the oscillations commence. Therefore, the oscillations always begin with the same phase after trigger release and synchronization is obtained. Trigger synchronization is precise while the oscillation frequency is stabilized without the use of any exacting bridge network or special components.

It will be understood that various changes in the details, materials and arrangements of parts, which have been herein described and illustrated in order to explain the nature of the invention, may be made by those skilled in the art within the principle and scope of the invention as expressed in the appended claims.

I claim:

1. A pulse controlled synchronized oscillator comprising:

(a) an oscillator circuit having a pair of transistors as part thereof, (b) tuned means coupling the output and the input of said oscillator circuit, (c) a pulse input circuit having included therein another transistor, and its collector element connected directly to the collector of the first of said pairs of transistors, (d) whereby when an input pulse is applied to the base of said another transistor, said another transistor will conduct and thereby cut off the first of said pairs of transistors for the duration of said input pulse.

2. The oscillator according to claim 1, wherein said tuned means includes a narrow band crystal filter and a tuned tank circuit connected in series between the collector of the second of said pair of transistors and the base of the first of said pair of transistors.

3. The oscillator according to claim 2, wherein said tank circuit includes an inductance in parallel with a pair of capacitors.

4. A synchronized crystal controlled oscillator comprising:

(a) a first transistor having emitter base and collector elements, (b) a tuned tank circuit having one end thereof connected to said base of said first transistor, (c) an amplifier-inverter having an input and output, said input connected to said collector of said first transistor, (d) filter means connected between said output and said tank circuit, (e) a second transistor having an emitter, base and collector elements, (f) a bias resistor, (g) a circuit path having included therein said bias resistor, said collectors of said first and second transistors and said emitter of said second transistor, (h) whereby when a trigger pulse is applied to said base of said second transistor said first transistor will be cutoff and when said pulse is removed an oscillatory signal will be present at said output of said amplifier-inverter.

5. The oscillator according to claim 4, wherein said tank circuit includes an inductance, a pair of capacitors and said filter means is connected intermediate said pair of capacitors.

6. The oscillator according to claim 5, wherein said filter means is a tuned quartz crystal.

References Cited by the Examiner

UNITED STATES PATENTS

| | | | |
|---|---|---|---|
| 3,040,272 | 6/1962 | Hukee | 331—159 X |
| 3,213,390 | 10/1965 | Faith et al. | 331—159 X |
| 3,217,269 | 11/1965 | Rowley et al. | 331—116 X |

ROY LAKE, *Primary Examiner.*

S. H. GRIMM, *Assistant Examiner.*